United States Patent [19]
Kogan

[11] Patent Number: 5,352,933
[45] Date of Patent: Oct. 4, 1994

[54] HIGH SPEED SAMPLE AND HOLD SIGNAL GENERATOR

[75] Inventor: Grigory Kogan, Portland, Oreg.

[73] Assignee: Tektronix, Inc., Wilsonville, Oreg.

[21] Appl. No.: 824,434

[22] Filed: Jan. 23, 1992

[51] Int. Cl.$^5$ .......................... H03K 5/01; H03K 5/15; G11C 27/02

[52] U.S. Cl. .................................... 307/268; 307/262; 307/265; 307/269; 307/353

[58] Field of Search ............... 307/261, 262, 265, 269, 307/353, 268; 328/62, 63, 67

[56] References Cited

U.S. PATENT DOCUMENTS

| | | | |
|---|---|---|---|
| 3,921,079 | 11/1975 | Heffner et al. | 328/62 |
| 4,271,488 | 6/1981 | Saxe . | |
| 4,647,791 | 3/1987 | Pellegrini | 307/269 |
| 4,922,452 | 5/1990 | Larson et al. . | |

*Primary Examiner*—John Zazworsky
*Attorney, Agent, or Firm*—Boulden G. Griffith

[57] ABSTRACT

An improved sample and hold signal generator produces very short delay intervals between successive sample-to-hold transitions that are both collectively and individually adjustable. A plurality of capacitors are charged to a precharge level upon the occurrence of a precharge signal and discharged to the threshold level of a plurality of amplifiers through a plurality of constant current sources upon the occurrence of a discharge signal. When the voltage on a particular capacitor is discharged to the threshold level, the associated amplifier produces a sample-to-hold signal transition and the voltage level of a signal being sampled is stored on a capacitor. In successive cells of the sample and hold generating means the threshold level is reached at incrementally varying delay times that are separated by approximately equal time intervals. Varying the precharge voltage, the constant current that discharges the capacitor, and, in one version, the threshold of non-linearity of a non-linear capacitor (source-drain coupled MOS FET transistor), can be used in different combinations to control the timing of individual cells or the delay of the whole set of cells.

16 Claims, 6 Drawing Sheets

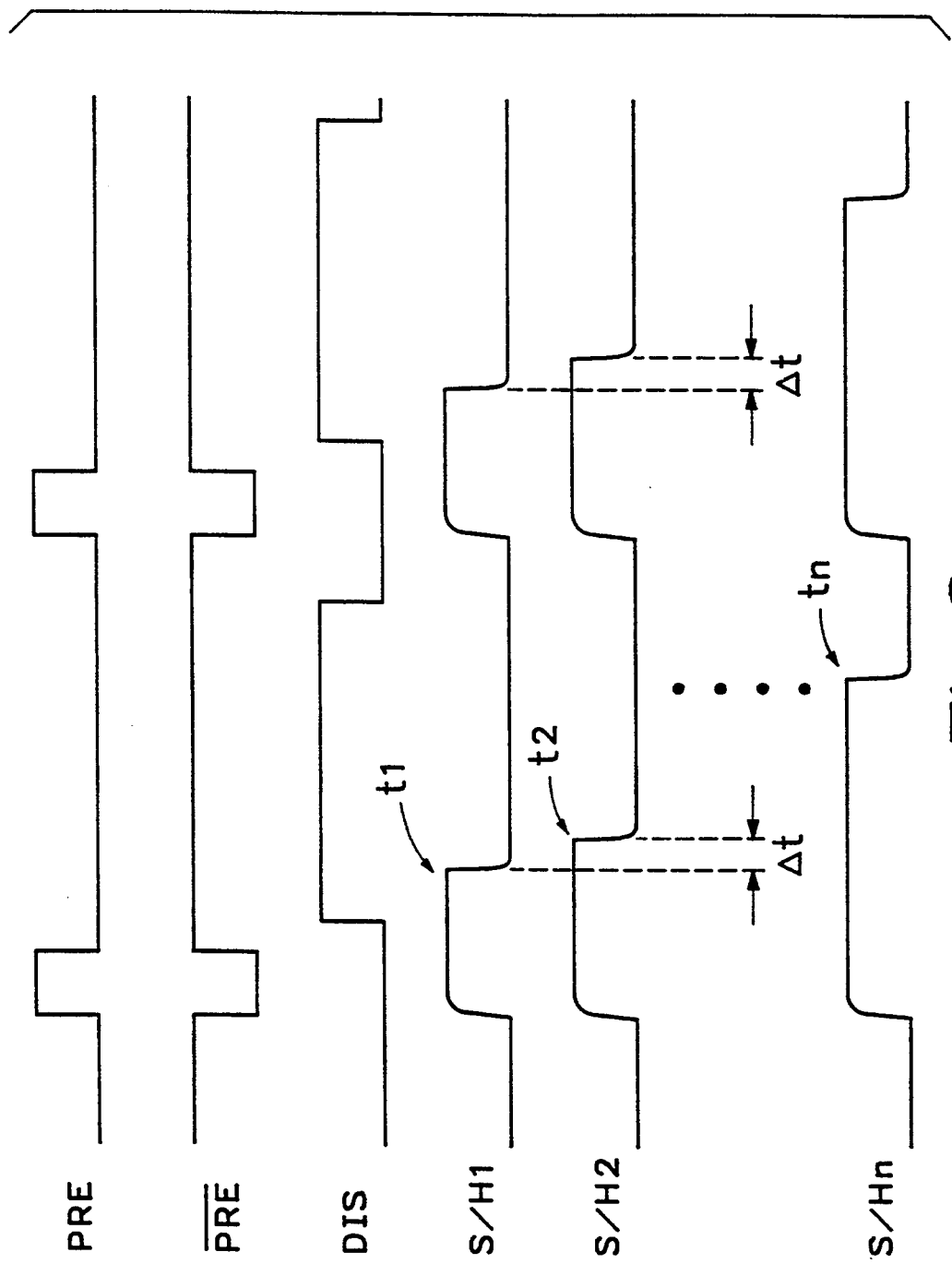

HIGH SPEED SAMPLE AND HOLD SIGNAL GENERATOR

BACKGROUND OF THE INVENTION

This invention relates to high speed data acquisition, and more particularly to a method and apparatus for generating sample and hold signals for a high speed signal acquisition system that have very short delay intervals between the sample-to-hold transitions of successive signals.

U.S. Pat. No. 5,144,525 to Saxe et al. for an "Analog Acquisition System Including a High Speed Timing Generator", hereby incorporated by reference, describes an analog signal acquisition system that includes an array of cells for capturing and storing an analog signal. This analog signal acquisition system is faster than another high speed, fast-in slow-out (FISO) acquisition system described in U.S. Pat. No. 4,271,488 to Saxe for a "High-Speed Acquisition System Employing an Analog Memory Matrix", hereby incorporated by reference.

In U.S. Pat. No. 5,144,525, each cell in the array is selected sequentially for sampling at a very rapid rate. Rows within this array of cells are selected by slow timing signals generated by a slow shift register, while individual cells within each row are selected by fast sample and hold signals, generated in a variety of alternative ways.

One of the methods of generating rapidly occurring hold signals that is discussed in the U.S. Pat. No. 5,144,525 (in connection with FIG. 3) is a tapped delay line created by the propagation of a strobe signal through a series of buffer amplifiers. Since each buffer amplifier contains two inverting amplifiers, this approach produces hold signals that are separated in time by two inverter amplifier delay intervals. The time between hold signals can be reduced to a single amplifier delay interval by substituting inverting amplifiers for the buffer amplifiers, as is described in connection with FIG. 5 of the U.S. Pat. No. 5,144,525. Both of these methods are limited by the inherent minimum propagation time of the inverting amplifiers.

Yet another approach for generating a series of fast sequential hold signals that is discussed in the U.S. Pat. No. 5,144,525 (in connection with FIG. 6) is to use a number of buffer amplifiers in parallel, with each buffer amplifier having a different propagation delay as a result of variations in the value of internal resistances or other parameters between successive buffer amplifiers. While this method can produce timing variations that are less than a single amplifier delay, accurately controlling the propagation times to obtain equal time differences between successive amplifiers is very difficult.

Still another approach that is discussed in the U.S. Pat. No. 5,144,525 (in connection with FIG. 7) entails sending a strobe signal through a series of R-C networks, with the output of each network triggering a Schmitt trigger circuit to produce a hold signal as the strobe signal decays below an input threshold level of the Schmitt trigger. It is also difficult to produce even time intervals between successive hold signals using this method because resistors and capacitors with tight tolerances are difficult to achieve within an integrated circuit.

A final approach that is described in the U.S. Pat. No. 5,144,525 (in connection with FIGS. 9 and 9A) is the use of a ring oscillator as a tapped delay line. The minimum delays attainable through the use of this method are limited to the propagation time of a single inverter amplifier.

As is described in the U.S. Pat. No. 5,144,525, a complicating factor in the architecture of a high speed timing generator is the requirement that the signal input be sampled as uniformly as possible throughout the entire acquisition period. This means that the interval between sampling the last element in one row and the first element in the next row should exactly equal the interval between sampling adjacent elements within the same row. This in turn means that the sum of the high speed sample and hold signal intervals has to be equal to exactly one period of the clock that produces the low speed timing signals from the shift register.

To explain how this requirement may be satisfied, a considerable portion of the U.S. Pat. No. 5,144,525 is devoted to detecting coincidence between the input to the tapped delay means and its last output, and to methods for adjusting the delay through individual buffer amplifiers to alter the cumulative timing of the fast sample and hold signal generator to create such a coincidence relationship.

Although a variety of methods for generating sample and hold signal sample-to-hold transitions that are closely and evenly spaced in time are disclosed in the U.S. Pat. No. 5,144,525 even the fastest and most adjustable of these methods have limitations in their speed and adjustability that it would be desirable to improve upon.

SUMMARY OF THE INVENTION

Accordingly, it is an object of the present invention to provide an improved sample and hold signals generator with very short delay intervals between successive sample-to-hold signal transitions.

It is a further object of the present invention to provide a sample and hold signal generation method that provides adjustability in both the timing of individual transitions relative to a reference timing signal and in the collective delay of a whole row of fast timing signals.

In accordance with the invention, a plurality of capacitors are charged to a precharge level upon the occurrence of a precharge signal and are discharged toward a threshold level of a plurality of amplifiers through a plurality of constant current sources upon the occurrence of a discharge signal. When the voltage on a particular capacitor is discharged to the threshold level, the associated amplifier produces a sample-to-hold signal transition and the voltage level of a signal being sampled is stored on a capacitor. In successive cells of the sample and hold signals generator the threshold level is reached at incrementally varying delay times that are separated by adjustable time intervals.

In one embodiment of the invention the amplifier is a Schmitt trigger, the capacitor is discharged through a MOS FET transistor, and the precharge levels for each cell are varied to obtain the incrementally different discharge times. In another embodiment of the invention the capacitor is provided by the inherent capacitance of the amplifier and feedback from the output of the amplifier controls a fast discharge path to accelerate the output transition once the threshold is reached.

In an alternative implementation of the invention the precharge voltage level is the same for each cell and the incrementally differing discharge times are achieved by varying a constant current control voltage on the gate of the MOS FET transistor that provides the constant current that discharges the capacitor. If the precharge level is used for varying the timing of individual cells, the constant current control voltage can be used to vary the collective timing of all of the cells. Conversely, if the constant current control voltage is used to vary the timing of individual cells, the precharge level can be used to vary the collective timing of all of the cells.

In yet another embodiment of the invention the capacitor is a non-linear capacitor produced by connecting the source and drain of a second MOS FET transistor. When the decreasing voltage from the discharging capacitor reaches a threshold of non-linearity, which is equal to the gate voltage of the second MOS FET plus approximately one volt, the capacitance produced by this transistor disappears and the source and drain are effectively connected to ground. The resulting rapid voltage decrease on its input quickly changes the state of the amplifier's output. In this embodiment the delay time can be varied by varying the threshold of non-linearity of the non-linear capacitor by controlling the gate voltage of the second MOS FET transistor, as well as by changing the precharge voltage or the constant current control voltage.

BRIEF DESCRIPTION OF THE DRAWINGS

FIG. 2 is a timing diagram of the operation of the sample and hold signal generator shown in FIG. 1.

DETAILED DESCRIPTION

Figure 1:
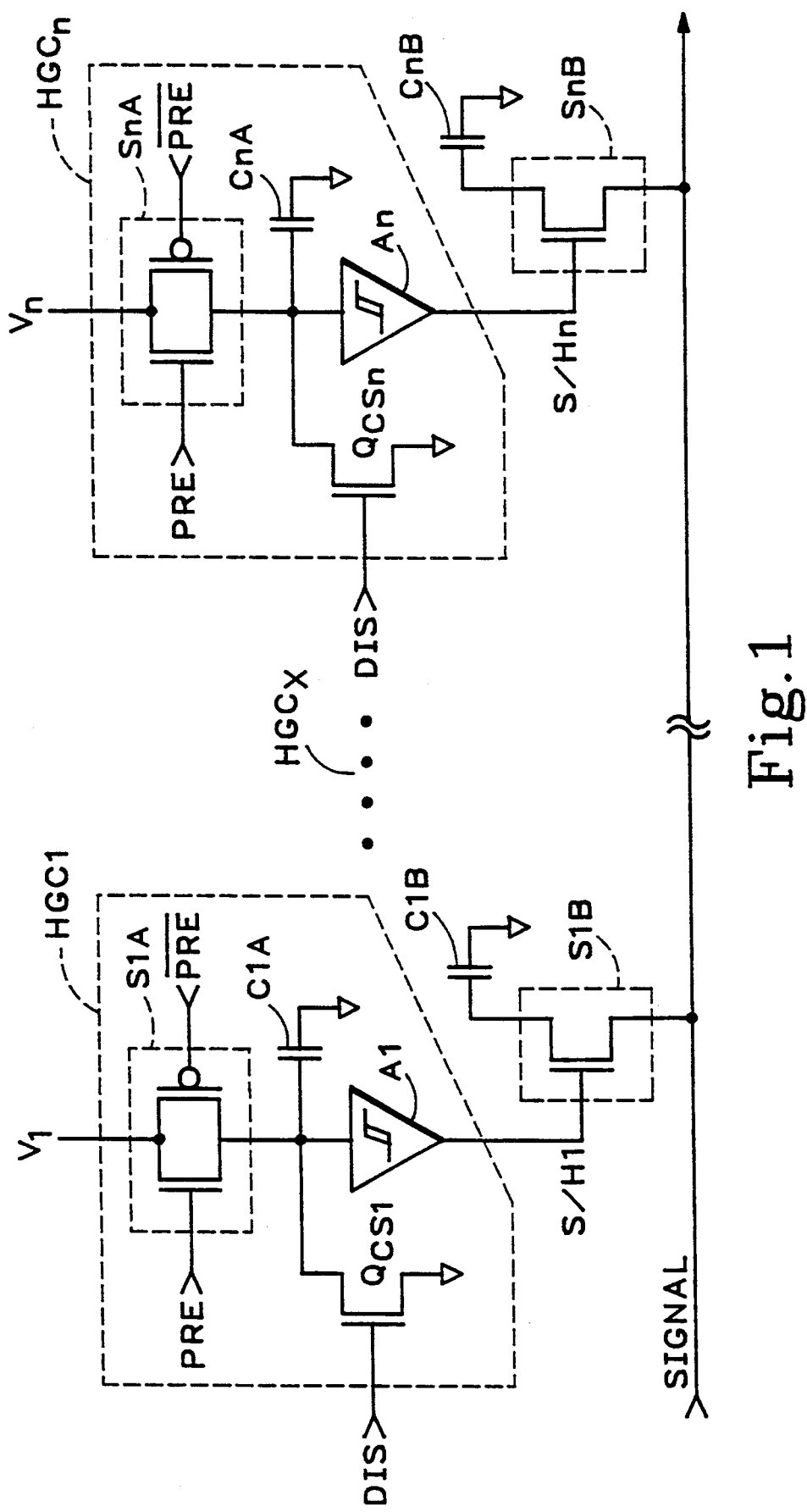
FIG. 1 is a schematic diagram of a first embodiment of a high speed sample and hold signal generator according to the present invention.

FIG. 1 is a schematic diagram of a first embodiment of a high speed sample and hold signal generator according to the present invention. The operation of the circuit shown in FIG. 1 will be discussed by reference to the timing diagram shown in FIG. 2 and the time versus voltage graph shown in FIG. 3A. The sample and hold generator of the present invention produces sample and hold (S/H) pulse outputs whose sample-to-hold transitions are progressively delayed by very short intervals that are adjustable. Each version of this sample and hold generator contains a plurality of sample and hold generator cells, $HGC_1$ through $HGC_n$, that are each respectively associated with sample holding capacitors $C_1B$ through $C_nB$ and sample-or-hold switches $S_1B$ through $S_nB$, respectively. The sample-to-hold transitions produced by each cell open their respective sample-or-hold switches, $S_1B$ through $S_nB$. As each sample-or-hold switch $S_1B$ through $S_nB$ opens, the analog voltage level that is present on the SIGNAL line at that instant is stored on the sample holding capacitor associated with that particular cell.

Control voltages $V_1$ through $V_n$ are supplied to the sample and hold generator cells $HGC_1$ through $HGC_n$ ($HGC_x$), respectively. In this version of the invention, these control voltages determine the characteristic delay of each cell. This delay is the time between the rising edge of a signal, DIScharge, that starts the sample and hold signal generation process, and the falling edges (sample-to-hold transitions) of the individual sample and hold signal outputs, $S/H_1$ to $S/H_n$. Each hold generator cell $HGC_x$ is identical, so only the operation of the first hold generator cell $HGC_1$ will be discussed in detail.

When a PREcharge signal goes active high and its complement /PREcharge (not-precharge) goes active low, switch $S_1A$ is closed and the control voltage $V_1$ is applied to capacitor $C_1A$. At this time DIScharge is low and current source transistor $Q_{cs1}$ is therefore turned off. The high input impedance of Schmitt trigger $A_1$ and of the high drain impedance of transistor $Q_{cs1}$ (which is off) permit capacitor $C_1A$ to fully charge to the level of control voltage $V_1$. The charge on capacitor $C_1A$ raises the input to Schmitt trigger $A_1$ above its input threshold and the output of the Schmitt trigger, sample and hold signal $S/H_1$, goes to its high state. A high level on $S/H_1$ holds switch $S_1B$ closed, i.e., the transistor fully "on", thereby connecting capacitor $C_1B$ to the SIGNAL to be sampled.

Figure 3A:
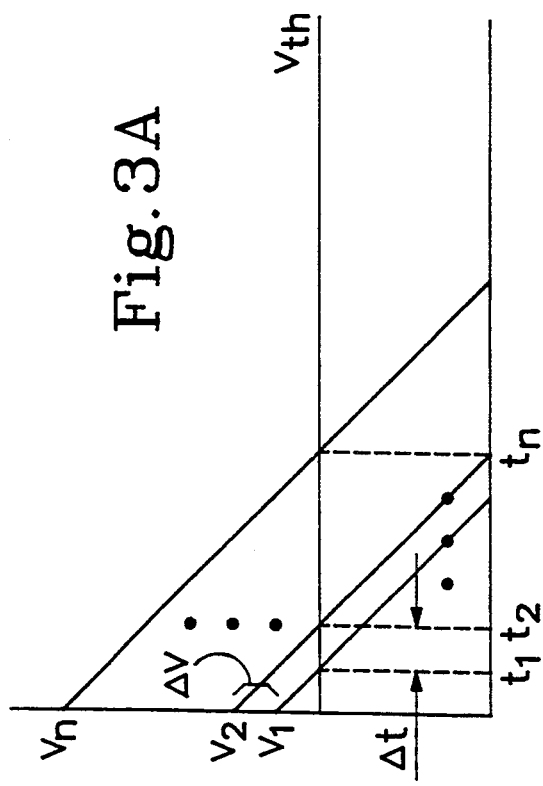
FIGS. 3A–3E are a series of time-versus-voltage graphs showing how the circuits shown in FIGS. 1, 4, and 5 achieve the timing delays that they produce.

Next, PREcharge and /PREcharge return to their inactive levels, causing switch $S_1A$ to open, thereby leaving capacitor $C_1A$ charged to the level of $V_1$ and the $S/H_1$ output of Schmitt trigger $A_1$ held in its high state. When DIScharge goes active high, the current source transistor $Q_{cs1}$ turns "on" and supplies a constant current that acts to discharge $C_1A$. Referring to FIG. 3A, at time $t_1$ the voltage on $C_1A$ falls below an input threshold, $V_{th}$, of the Schmitt trigger $A_1$. Referring again to FIGS. 1 and 2, when the voltage level on the input of the Schmitt trigger $A_1$ falls below $V_{th}$, the output of the Schmitt trigger $A_1$, the sample and hold signal $S/H_1$, goes low. A low $S/H_1$ opens switch $S1B$, i.e., turns the transistor off, thereby leaving the voltage level present on the SIGNAL line at that instant stored on capacitor $C_1B$.

Referring now to FIGS. 2 and 3A, the control voltage $V_2$ to $HGC_2$ (not shown in FIG. 1) begins to decay at the same time as does the control voltage $V_1$, i.e., at the time that DIScharge goes high. However, since control voltage $V_2$ is selected to be larger than control voltage $V_1$, and since the charge that it produces on $C_2A$ (not shown) is being discharged by a current source transistor of the same size as $Q_{cs1}$, it takes longer for the larger charge to decay to the threshold level $V_{th}$, which is then same for each of Schmitt trigger $A_1$ to $A_n$. Therefore, the output of hold generator $HGC_2$, the second sample and hold signal $S/H_2$, goes low at time $t_2$, which is $\Delta t$ later than $t_1$. When each of the control voltages $V_1$ through $V_n$ are separated by equal voltage differences, $\Delta V$, the time difference, $\Delta t$, between the falling edges of the outputs of each adjacent pair of hold generators $HGC_x,HGC_{x+1}$ are all equal. Successive hold generators $HGC_x$ produce sample and hold signals $S/H_x$ whose falling edges occur later and later, until the last hold generator $HGC_n$ produces a falling edge of $S/H_n$ that is $\Delta t*(n-1)$ later than $t_1$.

While amplifiers $A_1$ through $A_n$ are shown as Schmitt triggers in the particular embodiment shown, they could be replaced by any high-gain, high-frequency amplifier or analog comparator. Similarly, while switches $S_xA$, $S_xB$, and $S_xC$ are shown as MOS FET transistors, they could be any other high speed switching device, such as bipolar transistors. MOS FET transistors are a very suitable technology with which to implement a large, high speed data acquisition system because the MOS environment provides a low-power, low-cost, and high-density solution to the need for a large number of data acquisition cells in such a system.

Figure 4:
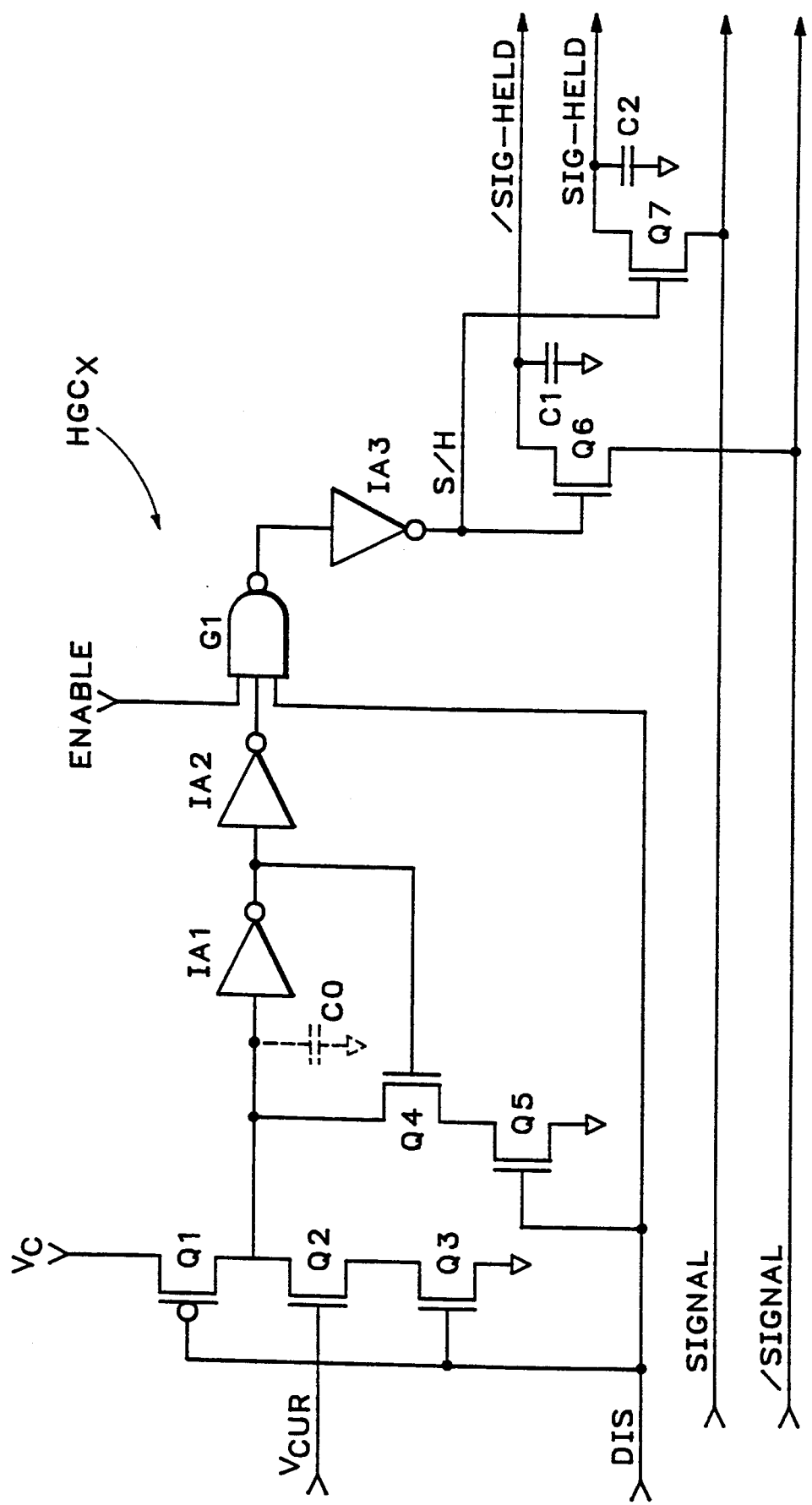
FIG. 4 is a schematic diagram of a second embodiment of a high speed sample and hold signal generator according to the present invention.

FIG. 4 shows second implementation of the sample and hold signal generator of the present invention. In this implementation the charge storage capacitor $C_1A$ of FIG. 1 has been replaced by the inherent input capacitance $C_0$ of the first inverter amplifier $IA_1$, and current source transistor $Q_{cs1}$ has been replaced by transistors $Q_2$ and $Q_3$. Transistor $Q_2$ is now the current source transistor, and the signal on its base, $V_{cur}$, now controls how much current flows through this leg of the circuit to discharge the capacitance $C_0$. Transistor $Q_3$ provides on/off switching for the discharge path under the control of the DIScharge signal.

An additional difference between this circuit and the one shown in FIG. 1 is that in this circuit the PREcharge signals have been replaced by the signal DIScharge controlling a p-MOS device, and the two complementary n-MOS and p-MOS transistors of switch $S_1A$ have been replaced by a single p-MOS transistor $Q_1$. When DIScharge is low and /DIScharge is high, transistor $Q_1$ is fully conducting and transistor $Q_3$ is fully off, and therefore the input capacitance $C_0$ of the first inverter amplifier $IA_1$ is charged to the level of the control voltage $V_c$. The presence of the control voltage on the input to the first inverting amplifier $IA_1$ produces a low output which is inverted again by second inverter amplifier $IA_2$ to supply a high input to NAND gate $G_1$. The ENABLE input to NAND gate $G_1$ will also be high if a pattern shifter (not shown) is currently supplying a "1" to this location.

As is further explained in the U.S. Pat. No. 5,144,525, during highest speed acquisitions every cell receives a high ENABLE signal, but during lower speed acquisitions only a fraction, such as a half or an eighth, of the data acquisition cells are enabled on each pass through a line of capture cells. After the line of capture cells has been partially used during one pass, a pattern register shifts the enable/disable pattern by one location and the acquisition process is repeated using another fraction of the line of capture cells.

When DIScharge goes high, transistor $Q_1$ is turned off, transistors $Q_3$ and $Q_5$ are turned on, and the third input to NAND gate $G_1$ is enabled. With all three inputs to NAND gate $G_1$ high, its output is low and this low is inverted by the third inverter amplifier $IA_3$ to make the sample/not-hold signal S/H high. When S/H is high, transistors $Q_6$ and $Q_7$ are both fully conducting and capacitors $C_1$ and $C_2$ are continuously charged to the level of the /SIGNAL and SIGNAL lines, respectively.

With transistor $Q_1$ shut off and transistor $Q_3$ fully on, the charge on the input capacitance $C_0$ of the first inverter amplifier $IA_1$ begins discharging through transistors $Q_2$ and $Q_3$. However, while transistor $Q_3$ can conduct a relatively high current, transistor $Q_2$ is biased to operate in the saturation mode at a relatively smaller current and therefore acts as a current limiter, controlling the rate of discharge of $C_0$. The voltage $V_{cur}$ on the gate of $Q_2$ can be used to adjust this current limit, and hence the rate at which $C_0$ discharges.

Figure 3B:
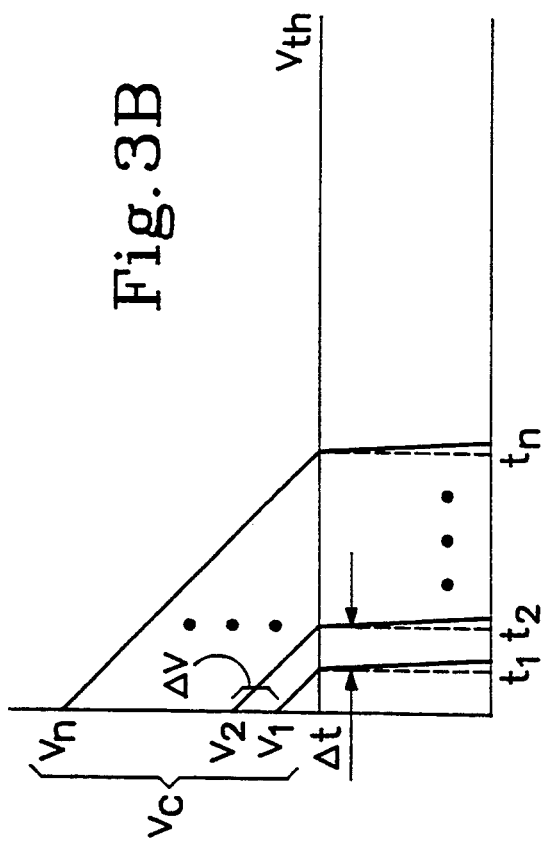

Referring to FIG. 3B as well as FIG. 4, the control voltage $V_c$, which varies from cell to cell, determines the initial charge (precharge) on $C_0$ and hence the time that it takes for the initial voltage ($V_1$ through $V_n$) to linearly decay to the level of the voltage threshold.

When the charge on $C_0$ falls below the input threshold of inverter amplifier $IA_1$, the output of $IA_1$ goes positive and turns on $Q_4$, thereby guaranteeing the immediate and complete discharge of $C_0$, thus maintaining inverter amplifier $IA_1$ in its low-input/high-output state. The high output of $IA_1$ is inverted by the second inverter amplifier $IA_2$ so that NAND gate $G_1$ is disabled and its output goes high. The high output of NAND gate $G_1$ is inverted to a low by inverter amplifier $IA_3$. The high-to-low transition of S/H is the sample-to-hold transition that turns off transistors $Q_6$ and $Q_7$ and thereby causes the voltages present on C1 and C2, i.e., the voltage levels present on /SIGNAL and SIGNAL, to be preserved as /SIG-HELD and SIG-HELD, respectively. As is shown in FIGS. 2 and 3B, the time delay between the rising and falling edges of the S/H signals is determined by the local control voltage level $V_c$ ($V_1$ to $V_n$) for that cell. And again, equal $\Delta V$'s between the $V_c$'s of successive cells produces equal $\Delta t$'s between the corresponding sample-to-hold edges.

Since the sample and hold generator cell shown in FIG. 4 is one of a number of such cells, the discharge current control voltage, $V_{cur}$, can be modified to control the time constant of all of these cells and the control voltages, $V_c$, can be varied from cell to cell to separate in time the sample-to-hold transitions of the individual cells. $V_{cur}$ can then be varied to change the time required for a whole row of cells, so that the time for a whole row of cells is equal to the time between the slow timing signals that select rows within the array of acquisition cells. (Control circuitry to vary $V_{cur}$, including a coincidence detector to measure which way the timing between a whole row of fast timing signals and one slow timing signal should be changed, is described in the U.S. Pat. No. 5,144,525.) It is generally necessary to have such a means to vary the cumulative delay of the whole row of sample and hold generators, because even if one manufacturing batch of such generators has exactly the right timing at one specific temperature, manufacturing process variations and/or temperature changes will make adjustment necessary under different circumstances.

Figure 3C:
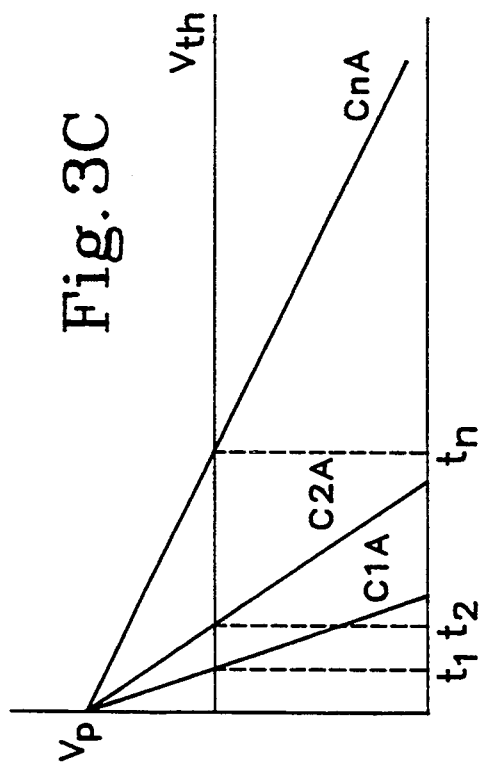
Figure 3D:
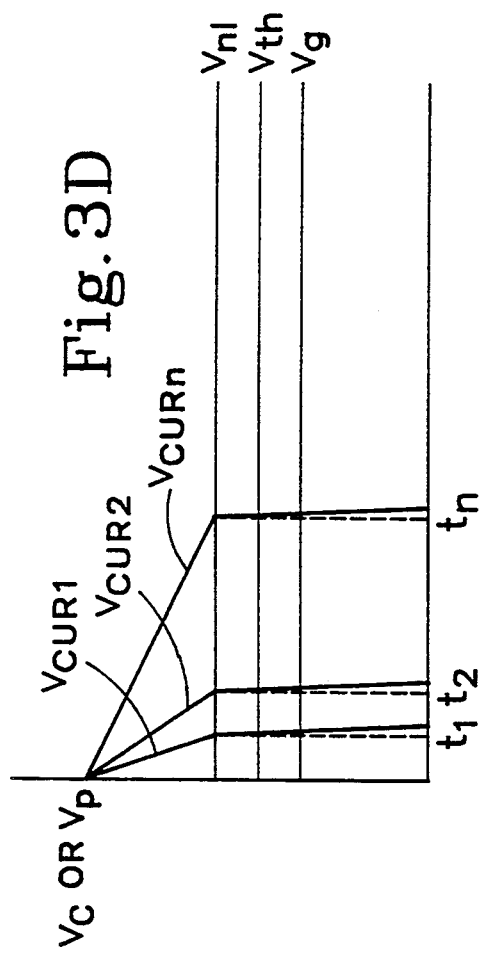

Referring to now to FIG. 3D, the circuit shown in FIG. 4 can be used with the roles of $V_c$ and $V_{cur}$ reversed. That is, $V_c$ can be a constant for the different cells in the sample and hold generator, and $V_{cur}$ can be varied from cell to cell. The varying rates of discharge produced by $V_{cur}1$ through $V_n$ lead to lines of varying slope, all originating at $V_c$. When this approach is used, it is $V_c$ rather than $V_{cur}$ that is varied to change the time required for a whole row of cells, so that the time for a whole row of cells is equal to the time between the slow timing signals that select rows within the array of acquisition cells, as described above.

Referring to FIG. 3C and again to FIG. 1, it is also possible to make $V_1$ through $V_n$ equal, so that they have the same effect as the constant precharge voltage $V_p$, and instead vary the values of $C_1A$ through $C_{1n}$ to control the sample-to-hold transition delay time between cells. The larger charges take longer times to discharge through the fixed current path of $Q_{csx}$ ($Q_{cs1}$ through $Q_{csn}$), so that the voltages decay (linearly) to the threshold voltage $V_{th}$ over incrementally different time intervals $t_1$ through $t_n$. This approach proves troublesome, however, for the longer times associated with the largest values of capacitance, such as $C_nA$, because when the voltage decay curve crosses the threshold voltage level $V_{th}$ at a slow rate, the resulting transition on the output of the Schmitt trigger $A_1$ occurs too slowly for ideal operation.

Figure 5:
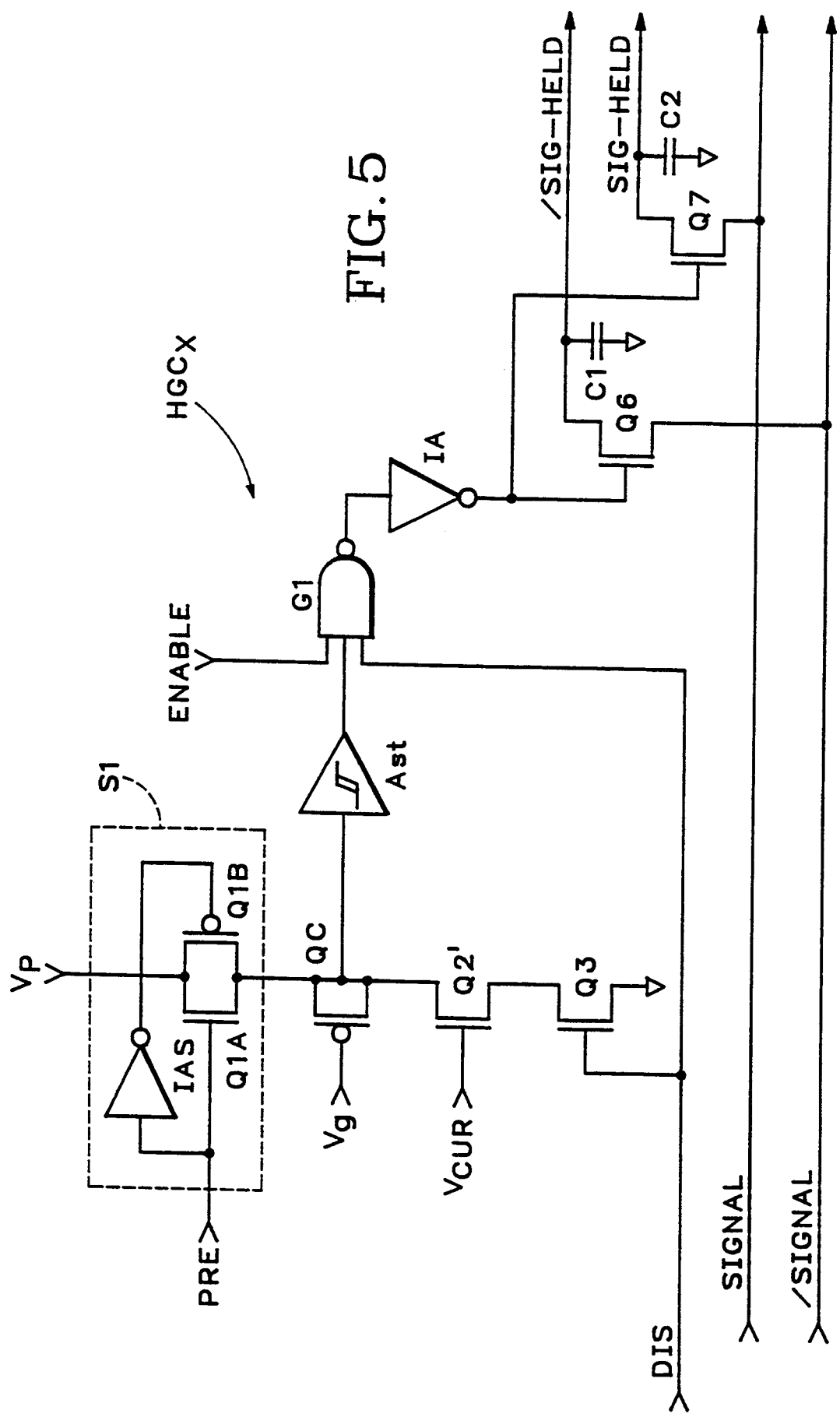
FIG. 5 is a schematic diagram of a third embodiment of a high speed sample and hold signal generator according to the present invention.

Referring now to FIG. 5, and to FIG. 3D, the problem described immediately above can be overcome by the use of a non-linear capacitors in place of $C_1A$ through $C_nA$. $Q_c$, with its source and drain tied together, provides such a non-linear capacitor. When the voltage present on the source and drain of $Q_c$ is more than a threshold of non-linearity, $V_{n1}$, which is approximately one volt above the gate voltage $V_g$ applied to $Q_c$, $Q_c$ acts like a normal (linear) capacitor. However, when the voltage on the source and drain of $Q_c$ falls below the threshold of non-linearity, $V_{n1}$, the capacitive characteristic of $Q_c$ disappears and is replaced by an effective short to ground, resulting in a virtually immediate discharge of the charge that had been present. The rapid drop in voltage on the input of the Schmitt trigger $A_{st}$ quickly takes that input below the threshold $V_{th}$ of the Schmitt trigger, which therefore responds with a very rapid transition on its output. This circuit thus avoids the problem of slow slewing of the S/H outputs of those cells of the sample and hold signal generator which have the greatest delays and hence the slowest inputs if normal capacitors are used.

Figure 3E:
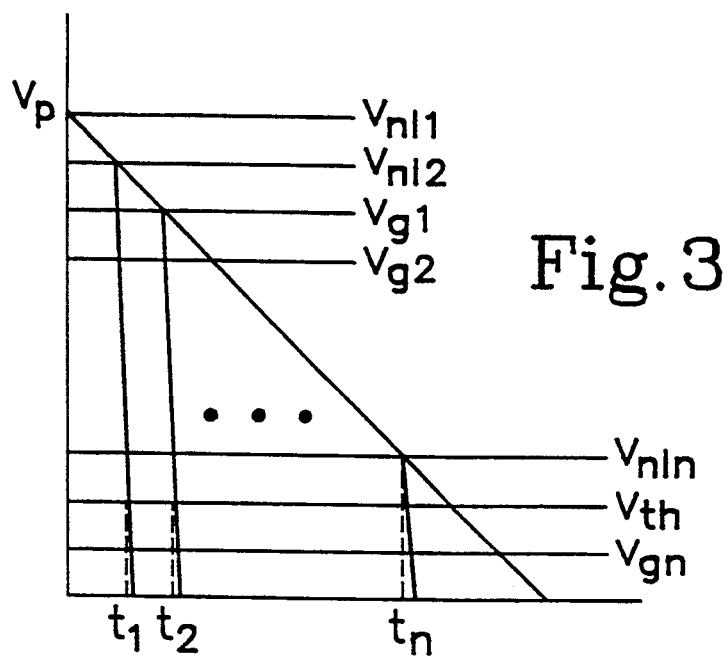

Since it is not practical to construct transistors $Q_c$ with variations in capacitance from cell to cell, delay differences from cell to cell can be obtained by controlling the application of different $V_{cur}$'s to each cell, as shown in FIG. 3D. Or, alternatively, as is shown in FIG. 3E, the gate voltage, $V_g$, can be varied from cell to cell to control the threshold of non-linearity. In each cell, as soon as the discharging voltage crosses the threshold of non-linearity it thereafter decreases very rapidly and quickly crosses the input threshold $V_{th}$ of the Schmitt trigger to produce a sharp sample-to-hold transition of S/H.

While a preferred embodiment of the present invention has been shown and descried, it will be apparent to those skilled in the art that many changes and modifications may be made without departing from the invention in its broader aspects. The claims that follow are therefore intended to cover all such changes and modifications as fall within the true scope of the invention.

I claim:

1. A method for producing a plurality of sequential sample-to-hold signal transitions for controlling the high speed sampling of data, the method comprising the steps of:

upon the occurrence of a precharge signal, charging a plurality of capacitors to a plurality of voltage levels all of the voltage levels being above a threshold voltage of a plurality of amplifiers;

upon the occurrence of a reference timing signal, discharging the plurality of capacitors with a plurality of constant current sources, the plurality of constant current sources are produced by a plurality of saturated transistors under the control of a plurality of reference voltages so to produce a plurality of characteristic discharge times; and as each capacitor discharges to the level of the threshold voltage, amplifying a transition across the threshold to produce the plurality of sequential sample-to-hold signal transitions.

2. A method according to claim 1 wherein the plurality of capacitors are non-linear capacitors that rapidly become effective shorts to ground when a stored charge falls below a threshold of non-linearity.

3. A method according to claim 2 wherein the plurality of non-linear capacitors comprise MOS FET transistors each having source and drain terminals connected together.

4. A method according to claim 3 wherein the plurality of non-linear capacitors become non-linear at a plurality of thresholds determined by a plurality of gate voltages applied to the gates of the MOS FET transistors.

5. A method for producing a plurality of sequential sample-to-hold signal transitions for controlling the high speed sampling of data, the method comprising the steps of:

upon the occurrence of a precharge signal, charging a plurality of capacitors to a plurality of voltage levels all of the voltage levels being above a threshold voltage of a plurality of amplifiers, the plurality of capacitors being non-linear capacitors that rapidly become effective shorts to ground when a stored charge falls below a threshold of non-linearity;

upon the occurrence of a reference timing signal, discharging the plurality of capacitors with a plurality of constant current sources; and as each capacitor discharges to the level of the threshold voltage, amplifying a transition across the threshold to produce the plurality of sequential sample-to-hold signal transitions.

6. A method according to claim 5 wherein the plurality of non-linear capacitors comprise MOS FET transistors each having source and drain terminals connected together.

7. A method according to claim 6 wherein the plurality of non-linear capacitors become non-linear at a plurality of thresholds determined by a plurality of gate voltages applied to the gates of the MOS FET transistors.

8. A method according to claim 5 wherein the plurality of constant current sources in the discharging step are independently controllable to produce a plurality of discharge currents under the control of a plurality of reference voltages so to produce a plurality of characteristic discharge times.

9. An circuit for producing a plurality of sequential sample-to-hold signal transitions for controlling the high speed sampling of data comprising:

a plurality of capacitors;

a plurality of amplifiers, each having one of the plurality of capacitors coupled to an input, and each amplifier having a characteristic input threshold voltage;

means for charging the plurality of capacitors to a plurality of voltage levels upon the occurrence of a precharge signal, all of the voltage levels being above the threshold voltage; and a plurality of constant current sources for discharging the plurality of capacitors upon the occurrence of a reference timing signal, the plurality of constant current sources comprise a plurality of saturated transistors under the control of a plurality of reference voltages so to produce a plurality of characteristic discharge times, whereby as each capacitor discharges to the level of the threshold voltage, outputs of the plurality of amplifiers produce a plurality of sequential sample-to-hold signal transitions.

10. A circuit according to claim 9 wherein the plurality of capacitors comprise non-linear capacitors that rapidly become effective shorts to ground when a stored voltage falls below a threshold of non-linearity.

11. A circuit according to claim 10 wherein the plurality of non-linear capacitors comprise MOS FET transistors each having source and drain terminals connected together.

12. A circuit according to claim 11 wherein the plurality of non-linear capacitors become non-linear at a plurality of thresholds determined by a plurality of gate voltages applied to the gates of the MOS FET transistors.

13. A circuit for producing a plurality of sequential sample-to-hold signal transitions for controlling the high speed sampling of data comprising:
   a plurality of non-linear capacitors that rapidly become effective shorts to ground when a stored voltage falls below a threshold of non-linearity;
   a plurality of amplifiers, each having one of the plurality of capacitors coupled to an input, and each amplifier having a characteristic input threshold voltage;
   means for charging the plurality of capacitors to a plurality of voltage levels upon the occurrence of a precharge signal, all of the voltage levels being above the threshold voltage; and
   a plurality of constant current sources for discharging the plurality of capacitors upon the occurrence of a reference timing signal,
   whereby as each capacitor discharges to the level of the threshold voltage, outputs of the plurality of amplifiers produce a plurality of sequential sample-to-hold signal transitions.

14. A circuit according to claim 13 wherein the plurality of non-linear capacitors comprise MOS FET transistors each having source and drain terminals connected together.

15. A circuit according to claim 14 wherein the plurality of non-linear capacitors become non-linear at a plurality of thresholds determined by a plurality of gate voltages applied to the gates of the MOS FET transistors.

16. A circuit according to claim 15 wherein the plurality of constant current sources are independently controllable to produce a plurality of discharge currents under the control of a plurality of reference voltages so to produce a plurality of characteristic discharge times.

* * * * *